United States Patent
Chou

(10) Patent No.: US 6,185,726 B1
(45) Date of Patent: Feb. 6, 2001

(54) SYSTEM AND METHOD FOR EFFICIENTLY DESIGNING INTEGRATED CIRCUIT DEVICES

(75) Inventor: Chen-Chi Chou, Milpitas, CA (US)

(73) Assignees: Sony Corporation, Tokyo (JP); Sony Electronics Inc., Park Ridge, NJ (US)

( * ) Notice: Under 35 U.S.C. 154(b), the term of this patent shall be extended for 0 days.

(21) Appl. No.: 09/089,682

(22) Filed: Jun. 3, 1998

(51) Int. Cl.[7] .............................. G06F 17/50; H03K 19/00
(52) U.S. Cl. ........................ 716/18; 716/1; 716/2; 716/4; 716/5; 703/14; 703/13
(58) Field of Search .................. 716/18; 703/14

(56) References Cited

U.S. PATENT DOCUMENTS

| | | | |
|---|---|---|---|
| 5,202,889 | * | 4/1993 | Aharon et al. .................. 371/27 |
| 5,510,654 | | 4/1996 | Nishino et al. .................. 257/773 |
| 5,517,432 | | 5/1996 | Chandra et al. ................ 364/578.1 |
| 5,541,849 | * | 7/1996 | Rostoker et al. ................ 364/489 |
| 5,544,071 | * | 8/1996 | Keren et al. .................... 364/489 |
| 5,598,344 | * | 1/1997 | Dangelo et al. ................ 364/489 |
| 5,604,895 | * | 2/1997 | Raimi ........................... 395/500 |
| 5,812,416 | * | 9/1998 | Gupte et al. .................... 364/490 |
| 5,870,308 | * | 2/1999 | Dangelo et al. ................ 364/489 |
| 5,886,900 | * | 3/1999 | Gascoyne et al. ............... 364/490 |
| 5,903,475 | * | 5/1999 | Gupte et al. .................... 364/578 |
| 5,926,396 | * | 7/1999 | Ohara ............................ 364/490 |
| 5,926,622 | * | 7/1999 | Hardin et al. .................. 395/183.09 |
| 5,953,519 | * | 9/1999 | Fura ............................. 395/500.19 |
| 5,961,557 | * | 10/1999 | Morimoto et al. ............... 701/1 |
| 5,978,573 | * | 11/1999 | Ohara ........................... 395/500.09 |
| 5,995,736 | * | 11/1999 | Aleksic et al. ................. 395/500.19 |
| 6,026,226 | * | 2/2000 | Heile et al. .................... 395/500.13 |

OTHER PUBLICATIONS

S. Tayal et al., System Level Verification of ASIC ChipSets, IEEE International ASIC Conference and Exhibit, pp. 283–287, Sep. 1993.*
J. Hartmann et al., Approaches to Regression Testing, Conference on Software Maintenance, pp. 368–372, Oct. 1988.*
M. Abrahams et al., RTL Verification Strategies, Wescon/98, pp. 130–134, Sep. 1998.*
R. Ernst et al., Simulation–based Verification for High–Level Synthesis, IEEE Design & Test of Computers, pp. 14–20, Mar. 1991.*
K.W. Hsu et al., Automated Maintenance of ASIC Libraries in a Dynamic Design Environment, IEEE ASIC Seminar and Exhibit, pp. 12/7.1–7.4, Sep. 1990.*

* cited by examiner

Primary Examiner—Paul R. Lintz
Assistant Examiner—Annette M. Thompson
(74) Attorney, Agent, or Firm—Gregory J. Koerner; Simon & Koerner LLP

(57) ABSTRACT

A system and method for efficiently designing integrated circuits provides a verification manager for verifying an integrated circuit design, a synthesis manager for synthesizing the integrated circuit design, a backend manager for implementing the integrated circuit design, and a processor for simultaneously controlling the verification manager, the synthesis manager, and the backend manager to create the integrated circuit design. The system and method generates a series of regression checkpoints controlled by the verification manager, and a series of timing checkpoints controlled by the synthesis manager to facilitate and expedite the integrated circuit design procedure.

26 Claims, 8 Drawing Sheets

SYSTEM AND METHOD FOR EFFICIENTLY DESIGNING INTEGRATED CIRCUIT DEVICES

BACKGROUND OF THE INVENTION

1. Field of the Invention

This invention relates generally to creating and implementing electronic circuits, and relates more particularly to a system and method for efficiently designing integrated circuit devices.

2. Description of the Background Art

Implementing an efficient and effective method for designing integrated circuits is a significant consideration of electronic component designers and manufacturers. The efficient design and testing of integrated circuits is often an extremely complex and time-consuming task due to the large number of electrical components and separate electrical circuits that typically comprise an integrated circuit. The complexity of the integrated circuit design procedure thus presents a substantial number of obstacles to successfully producing a final product that performs without operational errors.

Referring now to FIG. 1, a plan view of an exemplary floorplan for an integrated circuit 112 is shown, in accordance with the present invention. In the FIG. 1 example, integrated circuit 112 includes a number of circuit blocks 114–118, which are precisely positioned upon a surface of integrated circuit 112 according to a previously determined circuit design. Each of the circuit blocks 114–118 typically includes a substantial number of individual electrical components, including digital logic gates, which are selected to effectively perform the particular function for which integrated circuit 112 is designed.

According to modem practices, the procedure for designing and testing integrated circuit 112 may effectively be performed by integrated circuit designers who frequently use a special computer system to simulate the operation of a specific integrated circuit as the integrated circuit is being designed. The circuit designers may then advantageously test and modify the integrated circuit design to achieve optimal performance and reliability from the integrated circuit without actually re-fabricating the device after every design change or modification.

Due to the complex nature of integrated circuit design, successful techniques for decreasing design time without increasing design errors would likely result in more effective production of integrated circuits. The goals of reducing design time and reducing design errors must therefore be significant aspects of any effort to improve upon the currently existing integrated circuit design methodologies.

In some integrated circuit design procedures, the designing and testing are typically performed in serial fashion, with designers conducting the entire time-consuming design procedure to identify, correct and test a single design defect before any subsequent design defects may be addressed. The foregoing serial design procedure thus restricts the speed and efficiency of the integrated circuit design procedure, and results in an ineffective methodology for designing integrated circuits.

In other integrated circuit design procedures, designers have sometimes attempted to increase the speed and efficiency of the design procedure at the expense of permitting significant design errors to remain in the resultant integrated circuit designs. To compound this design error problem, the foregoing design procedures may fail to provide a coordinated checking system for managing design errors. The lack of a satisfactory design error checking system may result in design errors that are not detected, and also may create additional delays in the already lengthy integrated circuit design procedure.

SUMMARY OF THE INVENTION

An integrated circuit design procedure is required that permits circuit designers to effectively design and test new integrated circuit designs in a reduced amount of time by structuring the design procedure in an efficient manner. What is also required is an integrated circuit design procedure that advantageously provides an effective and organized methodology for checking integrated circuit parameters during the design procedure to facilitate rapid completion of the design procedure and thereby produce integrated circuits without design defects.

In accordance with the present invention, a system and method are disclosed for efficiently designing integrated circuit devices. The invention includes a computer system comprising a central processing unit (CPU) and a memory having a verification manager, a synthesis manager, and a backend manager.

In operation, an integrated circuit designer initially uses the verification manager to identify and correct a design defect that is present in an integrated circuit design that is currently being created and tested. The verification manager then generates new HDL (hardware description language) code corresponding to the entire integrated circuit design. The generated HDL code incorporates the design change necessitated by the foregoing design defect.

The verification manager then simulates and examines the operation of the integrated circuit design, especially in the circuitry of the previously-corrected design defect. Next, the verification manager performs a regression test and responsively determines whether the integrated circuit has passed the regression test. The regression test preferably analyzes the overall operation of the integrated circuit to ensure that the prior modification of the HDL code has not created additional design defects or related problems in other parts of the integrated circuit.

In addition to the regression test, the verification manager performs a checklist of selected regression checkpoints to eliminate any design errors, and to also facilitate the integrated circuit design procedure. If the integrated circuit fails to pass the regression test, then the verification manager selectively modifies the HDL code to correct for any problems detected by the failed regression test.

However, if the integrated circuit design passes the regression test, then a synthesis process begins. In one embodiment of the present invention, once the synthesis process begins, then a different designer may initiate another verification process to correct a new and separate design defect. Several designers may thus conduct multiple design processes concurrently to expedite the integrated circuit design procedure.

The synthesis manager next performs a synthesis procedure that preferably uses a synthesis program tool to convert the HDL code into specific electronic component specifications. Then, the synthesis manager performs a timing test and responsively determines whether the integrated circuit has passed the timing test. The timing test preferably analyzes the internal timing parameters of the integrated circuit to ensure that the circuit timing parameters fall within predetermined specifications for the particular integrated circuit design. In addition to the timing test, the synthesis manager performs a checklist of selected timing checkpoints, which eliminate any timing errors, and also facilitate the integrated circuit design procedure.

If the integrated circuit fails to pass the timing test, then, the synthesis manager modifies related constraint scripts to allow the integrated circuit to pass the timing test. However, if the integrated circuit design passes the timing test, then the synthesis manager generates a first net list which includes connectivity information specifying the entire integrated circuit design at the component level.

Then, a backend process begins to complete the final implementation of the integrated circuit design by specifying actual physical locations for the specific integrated circuit components. As discussed above, in many embodiments of the present invention, once the a verification, synthesis, or a backend process completes, then the designers may re-initiate those completed processes to continue refining a particular integrated circuit design. Several designers may thus conduct multiple design processes concurrently to expedite the integrated circuit design procedure in accordance with the present invention.

The backend manager then creates a floorplan, which includes physical locations for individual circuit blocks that contain corresponding electrical components. The backend manager preferably locates the circuit blocks to minimize timing problems and to effectively utilize the surface space of the integrated circuit. Then, the backend manager generates a second net list and an estimate SDF (standard delay format). The backend manager uses the floorplan to generate the estimate SDF, and also annotates the estimate SDF to the second net list. Since the floorplan does not contain timing information for components within the circuit blocks, the backend manager uses estimated statistical timing information to generate the estimate SDF.

Next, the synthesis manager again performs a timing test and responsively determines whether the integrated circuit has passed the timing test. As discussed above, the timing test preferably analyzes the internal timing parameters of the integrated circuit to ensure that the circuit timing parameters fall within predetermined specifications for the particular integrated circuit design. In addition to the timing test, the synthesis manager again performs a checklist of selected timing checkpoints to eliminate any timing errors, and to also facilitate the integrated circuit design procedure.

If the integrated circuit successfully passes the timing test, then the verification manager performs a regression test and determines whether the integrated circuit has passed the regression test. In addition to the regression test, verification manager again performs a checklist of selected regression checkpoints to eliminate any design errors.

If the integrated circuit design passes the regression test while using the estimate SDF, then the backend manager creates a layout which includes information describing the actual physical placement of individual electrical components within the circuit blocks on the substrate of the integrated circuit. Next, the backend manager generates an actual SDF, which contains information describing the completed integrated circuit design including connectivity information, specific components within the circuit blocks, and the physical timing between the individual components.

The design procedure then repeats the timing test. As discussed above the timing test preferably analyzes the internal timing parameters of the integrated circuit to ensure that the circuit timing parameters fall within predetermined specifications for the particular integrated circuit design. In addition to the timing test, the synthesis manager performs a modified checklist of selected timing checkpoints to eliminate any timing errors. Because the current timing test is performed after the backend manager has generated the actual SDF, the checklist of timing checkpoints includes a series of additional timing checkpoints that were not performed during previous timing tests.

In the event that the integrated circuit design passes the final timing test using the actual SDF, then the backend manager performs a final regression test. If the integrated circuit design passes the final regression test using the actual SDF, then the integrated circuit design procedure terminates with a tapeout event to generate the completed integrated circuit design. The present invention thus effectively implements a system and method for efficiently designing integrated circuit devices.

DETAILED DESCRIPTION OF THE PREFERRED EMBODIMENT

The present invention relates to an improvement in procedures for the design of electronic circuits. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention includes a system and method for efficiently designing integrated circuits comprising a verification manager for verifying an integrated circuit design, a synthesis manager for synthesizing the integrated circuit design, a backend manager for implementing the integrated circuit design, and a processor for simultaneously controlling the verification manager, the synthesis manager, and the backend manager to create the integrated circuit design. The system and method also includes a series of regression checkpoints controlled by the verification manager, and a series of timing checkpoints controlled by the synthesis manager to facilitate and expedite the integrated circuit design procedure.

Figure 2:
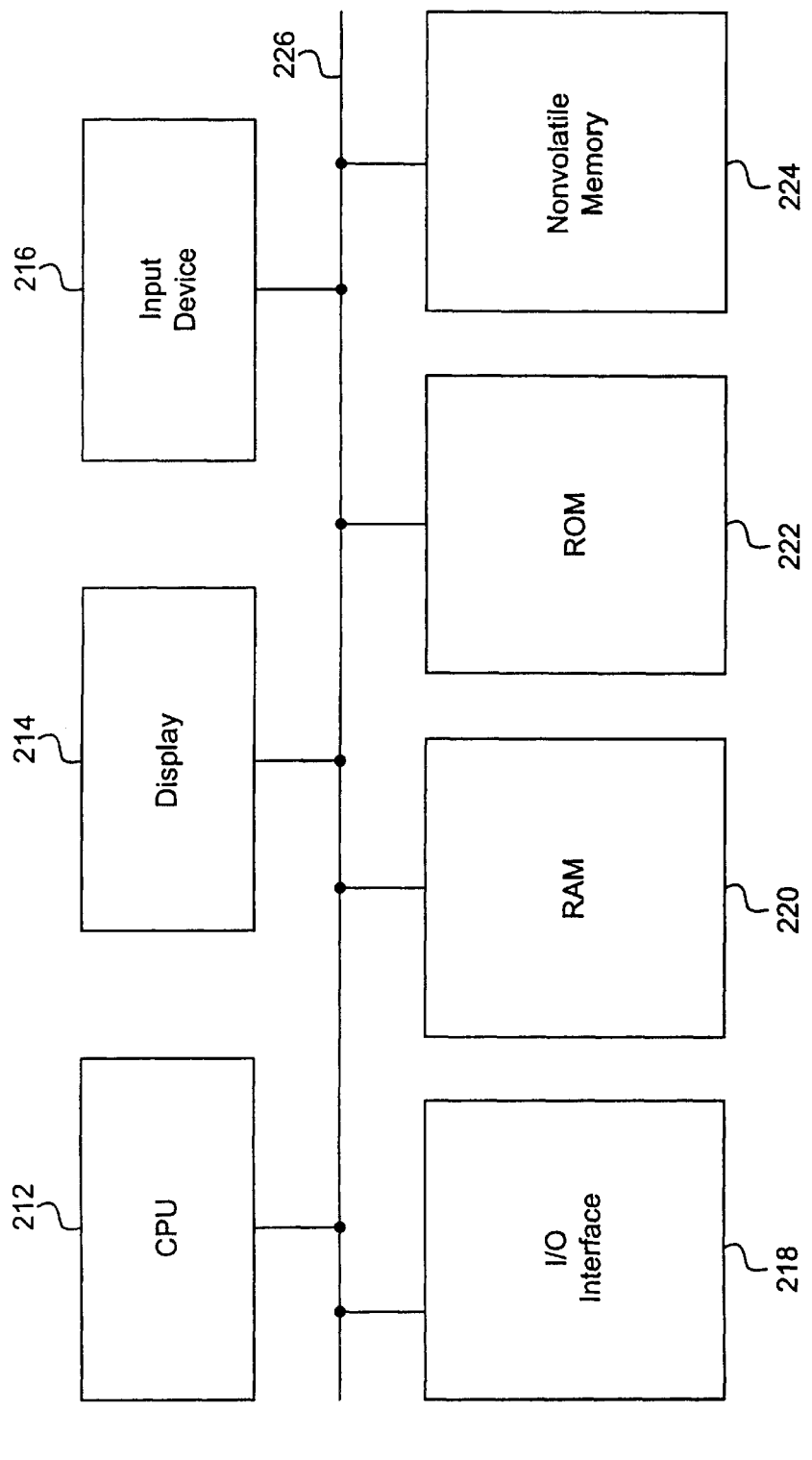
FIG. 2 is a block diagram of one embodiment of a computer system for designing integrated circuits, according to the present invention.

Referring now to FIG. 2, a block diagram of one embodiment of a computer system 210 for designing integrated circuits is shown, according to the present invention. In the FIG. 2 embodiment, computer system 210 includes a central processing unit (CPU) 212, a display 214, an input device 216, an input/output (I/O) interface 218, a random-access memory 220, a read-only memory 222, and a nonvolatile memory 224. The foregoing elements 212 through 224 of system 210 are each preferably coupled to a system bus 226. In alternate embodiments, computer system 210 may readily include additional displays 214 and multiple input devices 216, and in the preferred embodiment, CPU 212 is a processor device with multi-tasking capabilities. Furthermore, in alternate embodiments, a plurality of computer systems 210 may be used in accordance with the present invention.

Figure 3:
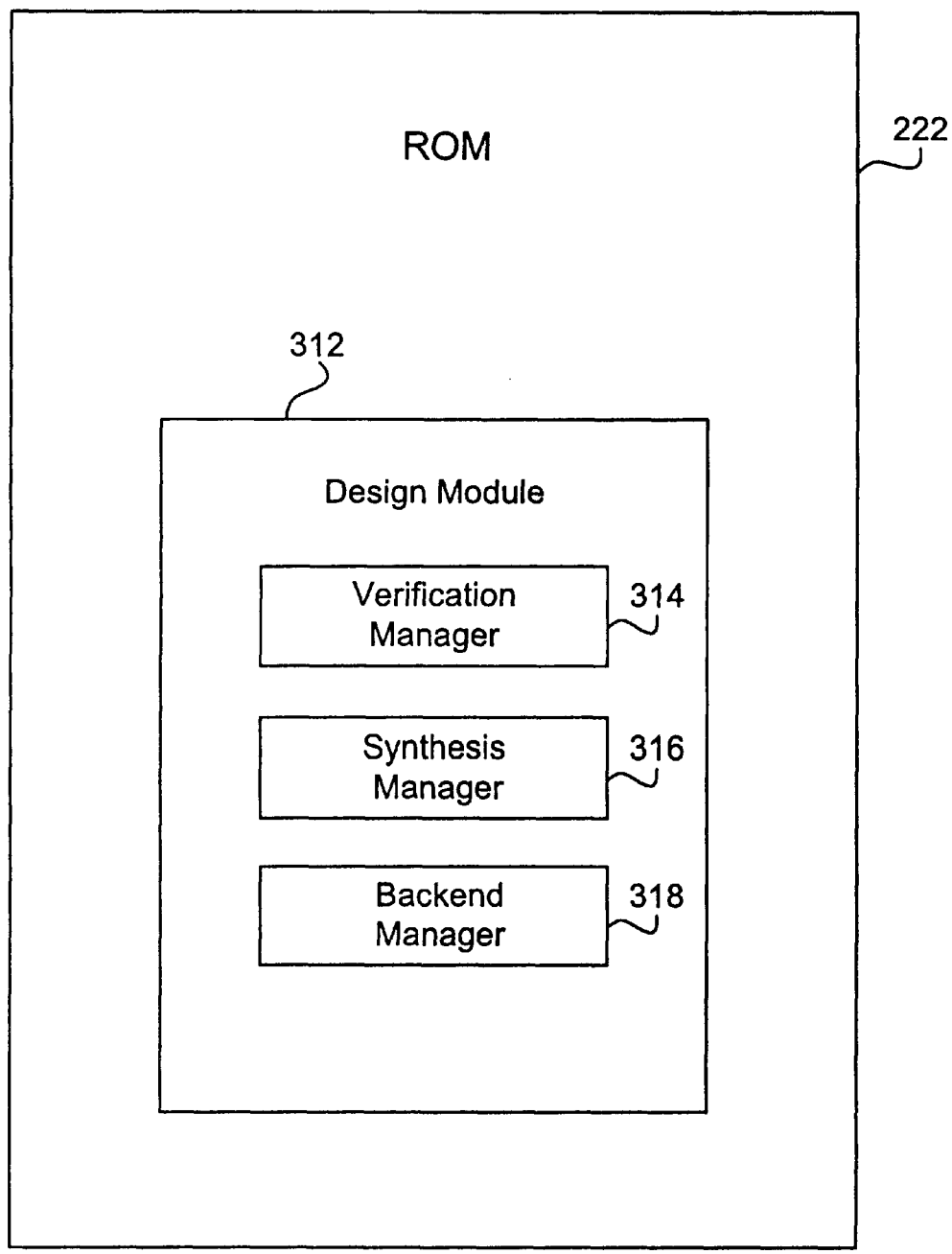
FIG. 3 is a block diagram of one embodiment of the ROM of FIG. 2, according to the present invention.

Referring now to FIG. 3, a block diagram of one embodiment of ROM 222 of FIG. 2 is shown, according to the present invention. In the FIG. 3 embodiment, ROM 222 includes a design module 312 which is preferably executed by CPU 212 whereby one or more integrated circuit designers may utilize computer system 210 to efficiently design and test integrated circuits in accordance with the present invention. In the FIG. 3 embodiment, design module 312 includes a verification manager 314, a synthesis manager 316, and a backend manager 318.

Verification manager 316 preferably performs a discrete verification process upon an integrated circuit design to verify that the operation and functionality is free from design defects or errors. Synthesis manager 316 preferably performs a discrete synthesis process to synthesize or convert an integrated circuit design to the electrical component or logic gate level. Backend manager 318 preferably performs a discrete final implementation process to designate the physical position of the synthesized integrated circuit design on the surface of the integrated circuit.

In the present invention, CPU 212 may concurrently execute verification manager 314, synthesis manager 316, and backend manager 318 to permit individual designers to simultaneously control different elements of design module 312. For example, a first designer may perform a verification process using verification manager 314, while a second designer concurrently performs a synthesis process using synthesis manager 316, and while a third designer concurrently performs a backend process using backend manager 318. The operation and functionality of verification manager 314, synthesis manager 316, and backend manager 318 are further discussed below in conjunction with FIGS. 5 through 8.

Figure 4:
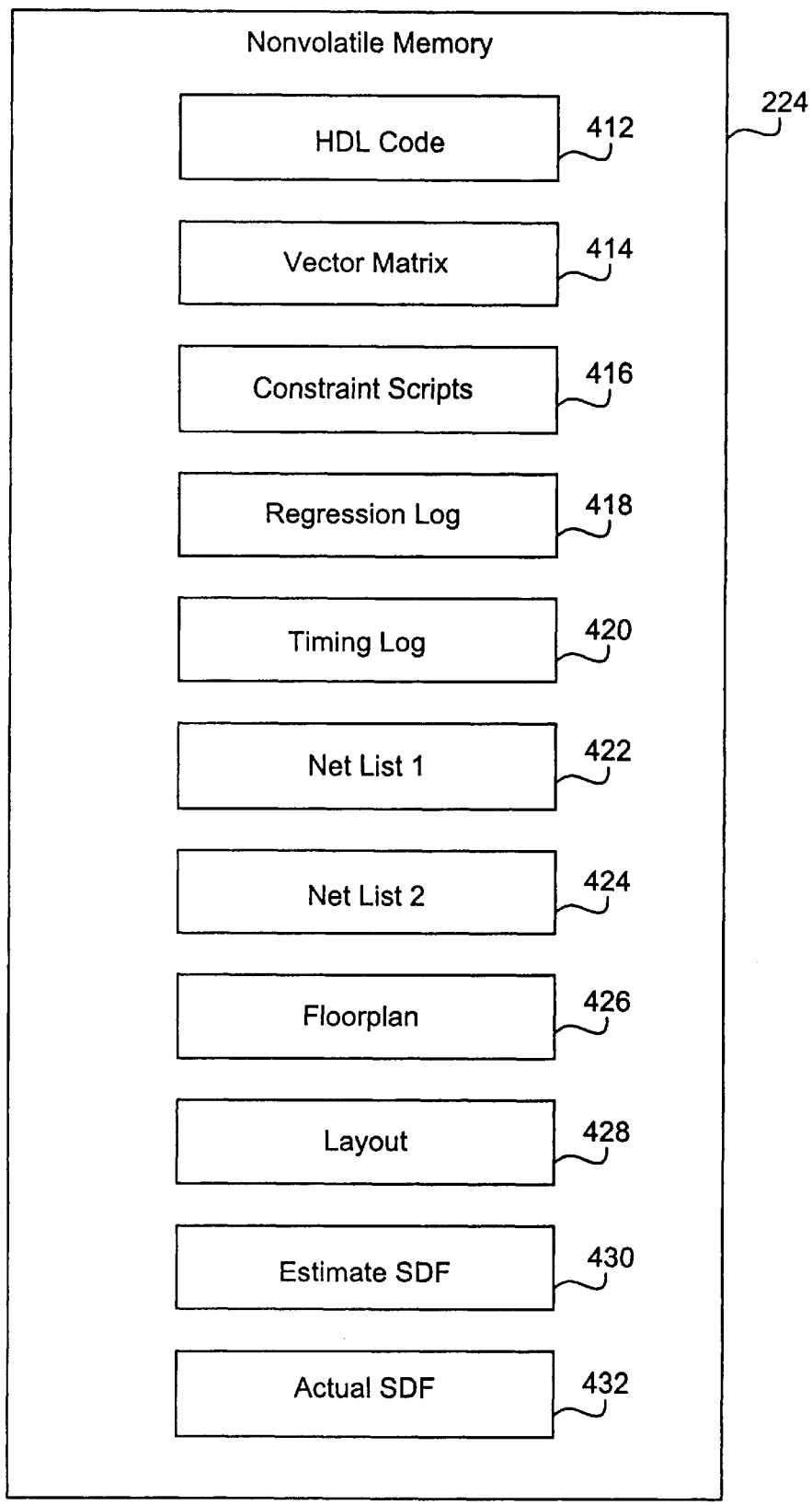
FIG. 4 is a block diagram of one embodiment of the nonvolatile memory of FIG. 2, according to the present invention.

Referring now to FIG. 4, a block diagram of one embodiment of the nonvolatile memory 224 of FIG. 2 is shown, according to the present invention. In the FIG. 4 embodiment, nonvolatile memory 224 includes hardware description language (HDL) code 412, vector matrix 414, constraint scripts 416, regression log 418, timing log 420, net list 1 (422), net list 2 (424), floorplan 426, layout 428, estimate standard delay format (SDF) 430, and actual SDF 432. In alternate embodiments, nonvolatile memory 224 may readily include elements that are additional or different than those shown in conjunction with the FIG. 4 embodiment. The operation and functionality of the contents of nonvolatile memory 224 are further discussed below in conjunction with FIGS. 5 through 8.

Figure 5:
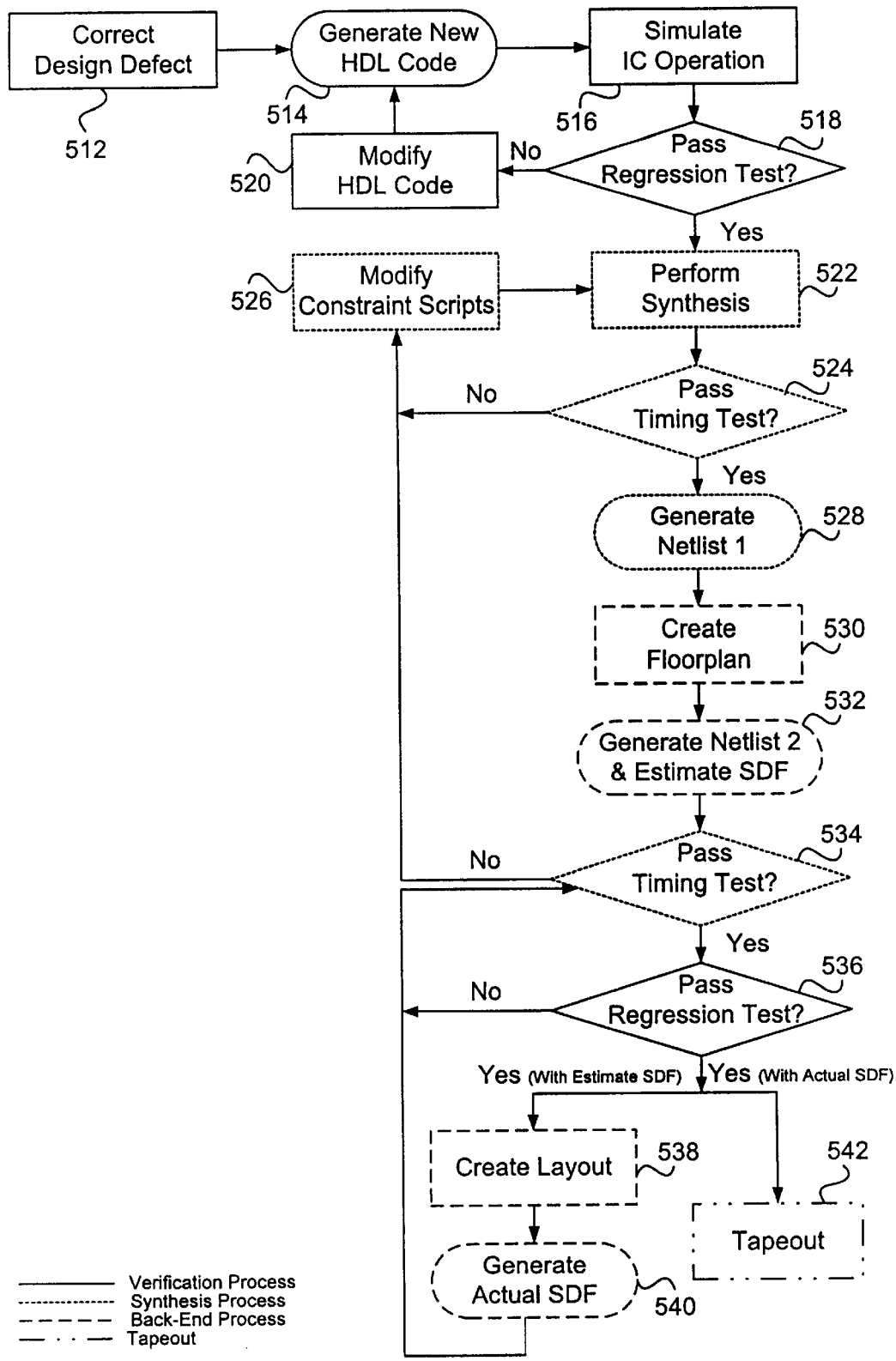
FIG. 5 is a flowchart of preferred method steps for efficiently designing an integrated circuit, according to the present invention.

Referring now to FIG. 5, a flowchart of preferred method steps for efficiently designing an integrated circuit is shown, according to the present invention. FIG. 5 includes a legend to indicate whether each of the individual FIG. 5 method steps is part of a verification process (performed by verification manager 314), or whether each of the individual method steps is part of a synthesis process (performed by synthesis manager 316), or whether each of the individual method steps is part of a backend process (performed by backend manager 318).

The FIG. 5 method steps that are a part of the verification process performed by verification manager 314 are enclosed by a solid line. The FIG. 5 method steps that are a part of the synthesis process performed by synthesis manager 316 are enclosed by a dotted line. The FIG. 5 method steps that are a part of the backend process performed by backend manager 318 are enclosed by a dashed line. Although the FIG. 5 flowchart presents method steps arranged in a sequential order to show an overview of the entire integrated circuit design procedure, the verification, synthesis, and backend processes may also be readily performed as discrete processes by verification manager 314, synthesis manager 316, and backend manager 318, respectively. Concurrently performing the verification, synthesis, and backend processes in parallel thus provides an efficient and time-saving method of designing integrated circuits according to the present invention.

Initially, in step 512 of FIG. 5, an integrated circuit designer uses verification manager 314 to identify and correct a design defect that is present in an integrated circuit design that is being designed and tested. For example, a design defect may cause a specific state machine within the integrated circuit design to become unchangeably fixed in a certain logic state. In step 514, verification manager 314 then generates new HDL (hardware description language) code 412 corresponding to the entire integrated circuit design. The HDL code 412 generated in step 514 incorporates the design change necessitated by the design defect from foregoing step 512. The newly-generated HDL code 412 is preferably stored into nonvolatile memory 224.

In step 516, verification manager 314 simulates and examines the operation of the integrated circuit, especially in the circuitry of the previously-corrected design defect. For example, if a given state machine was operating defectively, then the designers may write a test vector and run the test vector through the defective state machine circuitry to verify that the design defect has been remedied by the foregoing change of HDL code 412.

In step 518, verification manager 314 performs a regression test and responsively determines whether the integrated circuit has passed the regression test. The regression test preferably analyzes the overall operation of the integrated circuit to ensure that the prior modification of the HDL code 412 (in step 520) has not created additional design defects or related problems in other parts of the integrated circuit design. For example, designers may run a substantial number of different test vectors through the integrated circuit to test the functionality of the entire device.

In addition to the regression test, step 518 further includes a checklist of carefully selected regression checkpoints which verification manager 314 performs to eliminate any design errors, and to also facilitate the integrated circuit design procedure. The foregoing regression checkpoints are further discussed below in conjunction with FIG. 6. If the integrated circuit fails to pass the regression test of step 518, then, in step 520, verification manager 314 selectively modifies HDL code 412 to correct for any problems detected by the failed regression test. The FIG. 5 procedure then returns to step 514.

However, in step 518, if the integrated circuit design passes the regression test, then, in step 522, a synthesis process begins. In one embodiment of the present invention, once the synthesis process begins in step 522, then a different designer may initiate another verification process in step 512 to correct new and separate design defect. Several designers may thus conduct multiple design processes concurrently to expedite the integrated circuit design procedure.

In step 522, synthesis manager 316 performs a synthesis procedure that preferably uses a synthesis program tool to convert HDL code 412 into specific electrical component specifications. Typically, the synthesis procedure of step 522 selects specific electrical components but does not specify their physical location on the surface of the integrated circuit.

In step 524, synthesis manager 316 performs a timing test and responsively determines whether the integrated circuit has passed the timing test. The timing test preferably analyzes the internal timing parameters of the integrated circuit to ensure that the circuit timing parameters fall within predetermined specifications for the particular integrated circuit design. For example, the timing test may check the setup timing and hold times between integrated circuit components. In addition to the timing test, step 524 further includes a checklist of selected timing checkpoints which synthesis manager 316 performs to eliminate any timing errors, and to also facilitate the integrated circuit design procedure. The foregoing timing checkpoints are further discussed below in conjunction with FIG. 7.

If the integrated circuit fails to pass the timing test of step 524, then, in step 526, synthesis manager 316 modifies constraint scripts 416 to allow the integrated circuit to pass the timing test of step 524. Constraint scripts 416 are constraints that affect and limit the synthesis procedure of step 522, depending on the particular integrated circuit design. After the constraint scripts are modified in step 526, then the FIG. 5 procedure returns to step 522.

However, in step 524, if the integrated circuit design passes the timing test, then synthesis manager 316 generates net list 1 (422) which is preferably stored into nonvolatile memory 224. Net list 1 (422) typically includes connectivity information specifying the entire integrated circuit design at the component level.

In step 530, a backend process begins to complete the final implementation of the integrated circuit design by specifying actual physical locations for the specific integrated circuit components. As discussed above, in many embodiments of the present invention, once the a verification, synthesis, or a backend process completes, then designers may re-initiate those processes to continue refining a particular integrated circuit design. Several designers may thus conduct multiple design processes concurrently to expedite the integrated circuit design procedure, in accordance with the present invention.

Figure 1:
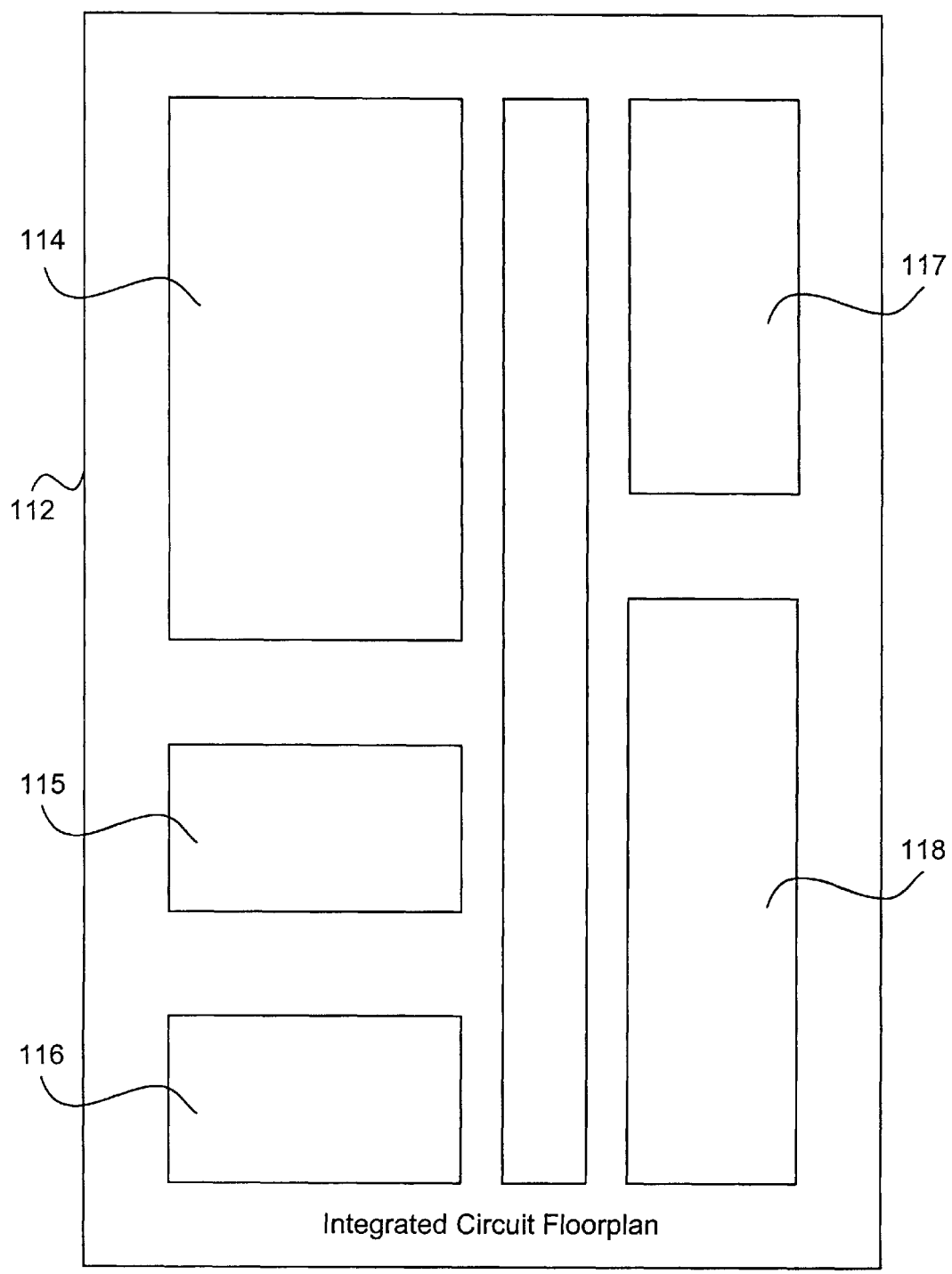
FIG. 1 is a plan view of an exemplary floorplan for an integrated circuit.

In step 530, backend manager 318 creates a floorplan 426, which is preferably stored into nonvolatile memory 224. Floorplan 426 includes physical locations for individual circuit blocks 114 (FIG. 1) that each contain corresponding electrical components. Backend manager 318 preferably locates circuit blocks 114–118 to minimize timing problems and to effectively utilize the surface space of the integrated circuit.

Then, in step 532, backend manager 318 generates a net list 2 (424) and an estimate SDF (standard delay format) 430 which are preferably stored into nonvolatile memory 224. Net list 2 (424) is based on floorplan 426 which contains timing information regarding circuit blocks 114–118. Net list 2 (424) is therefore more accurate than the previously-generated net list 1 (422) which contained connectivity information but not timing information. Backend manager 318 uses floorplan 426 to generate estimate SDF 430, and also annotates estimate SDF 430 to net list 2 (424). Since floorplan 426 does not contain timing information for components within circuit blocks 114–118, backend manager 318 uses estimated statistical timing information to generate estimate SDF 430.

In step 534, synthesis manager 316 again performs a timing test and responsively determines whether the integrated circuit has passed the timing test. As discussed above, the timing test preferably analyzes the internal timing parameters of the integrated circuit to ensure that the circuit timing parameters fall within predetermined specifications for the particular integrated circuit design. In addition to the timing test, step 534 further includes a checklist of selected timing checkpoints which synthesis manager 316 performs to eliminate any timing errors, and to also facilitate the integrated circuit design procedure. The foregoing timing checkpoints are further discussed below in conjunction with FIG. 7.

If the integrated circuit fails to pass the timing test of step 524, then the FIG. 5 procedure returns to step 526. However, if the integrated circuit successfully passes the timing test of step 524, then, in step 536, verification manager 314 performs a regression test and responsively determines whether the integrated circuit has passed the regression test. The regression test preferably analyzes the overall operation of the entire integrated circuit. In addition to the regression test, step 536 further includes a checklist of selected regression checkpoints which verification manager 314 performs to eliminate any design errors, and to also facilitate the integrated circuit design procedure. The foregoing regression checkpoints are further discussed below in conjunction with FIG. 6. If the integrated circuit fails to pass the regression test of step 536, then, the FIG. 5 procedure then returns to step 534. In one embodiment, if the integrated circuit design fails the regression test of step 536 more than a predetermined number of times, then verification manager 314 detects an error condition.

However, in step 536, if the integrated circuit design passes the regression test while using the estimate SDF 430 generated in step 532, then, in step 538, backend manager 318 creates layout 428 which is preferably stored into nonvolatile memory 224. Layout 428 includes information describing the actual physical placement of individual electrical components within circuit blocks 114–118 on the substrate of the integrated circuit.

Next, backend manager 318 generates actual SDF 540 which is preferably stored into nonvolatile memory 432. Actual SDF 540 contains information describing the completed integrated circuit design including connectivity, specific components within circuit blocks 114–118, and the physical timing between the individual components.

Following step 540, the FIG. 5 design procedure returns to step 534 to repeat a timing test. As discussed above the timing test preferably analyzes the internal timing parameters of the integrated circuit to ensure that the circuit timing parameters fall within predetermined specifications for the particular integrated circuit design. In addition to the timing test, step 534 further includes a checklist of selected timing checkpoints. Because the current timing test is performed after backend manager 318 has generated the actual SDF 540, the timing checkpoints includes a series of additional checkpoints that were not included in the previous timing tests. The foregoing additional checkpoints are further discussed below in conjunction with FIG. 8.

In the event that the integrated circuit design passes the final timing test using actual SDF 432 in step 534, then backend manager 318 performs a final regression test in step 536. If the integrated circuit design passes the final regression test using actual SDF 432 in step 536, then the FIG. 5 design procedure terminates with a tapeout event in step 542 to generate the completed integrated circuit design.

Figure 6:
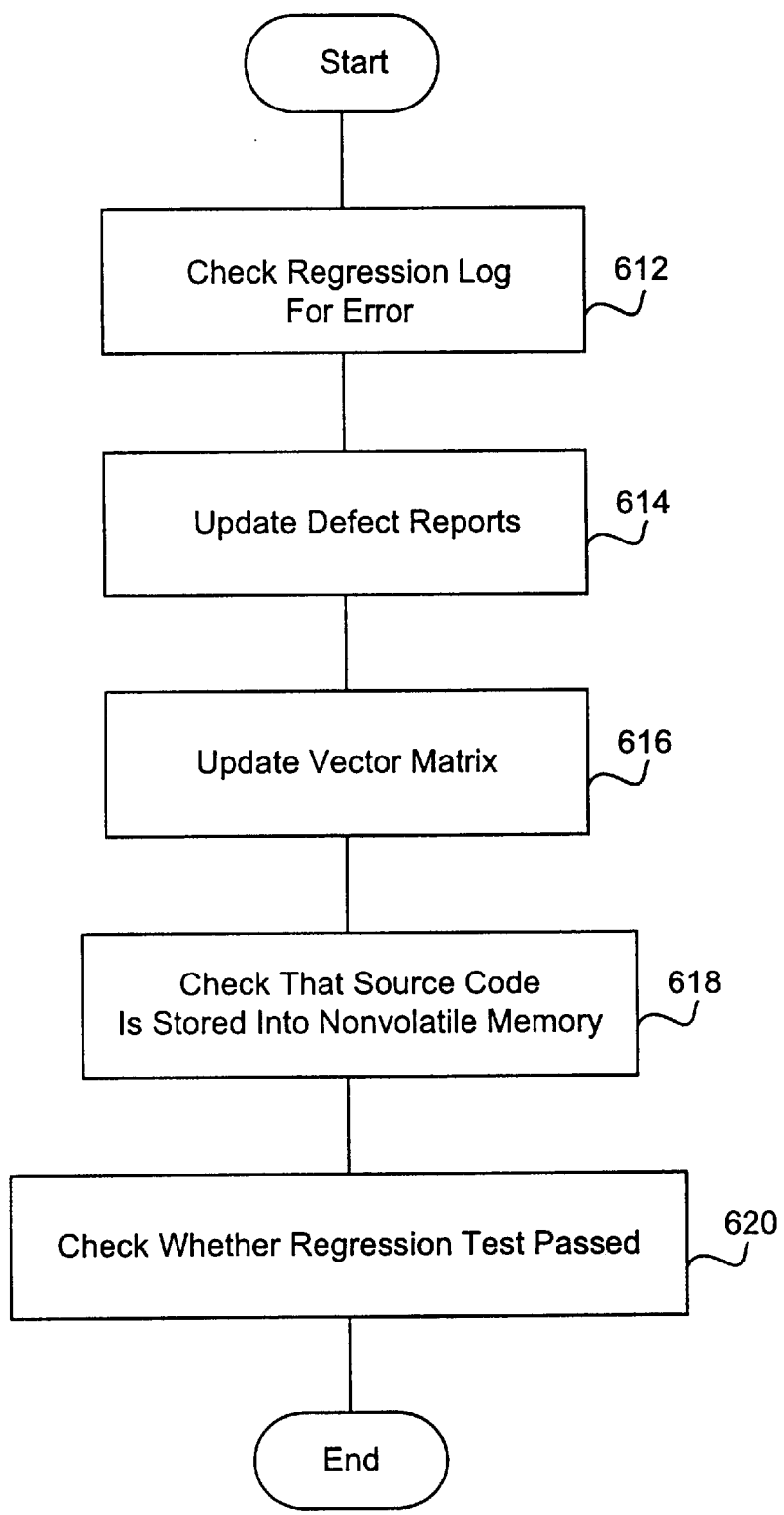
FIG. 6 is a flowchart of method steps for one embodiment of regression checkpoints, according to the present invention.

Referring now to FIG. 6, a flowchart of method steps for one embodiment of regression checkpoints (from FIG. 5, steps 518 and 536) is shown, according to the present invention. However, in alternate embodiments, the foregoing regression checkpoints may readily include checkpoints that are different or in another sequence than those shown in the FIG. 6 embodiment.

Initially, in step 612, verification manager 314 checks regression log 418 in nonvolatile memory 224 to determine whether there is any indication of an error indication for the design procedure. Then, in step 614, verification manager 314 updates a design defect report to include any relevant information that has not yet been posted to the design defect report. In step 616, verification manager 616 updates vector matrix 414 in nonvolatile memory 224 to include any additional test vectors that are have not already been recorded in vector matrix 414.

Next, in step 618, verification manager 314 checks to determine whether all relevant source code (such as HDL Code 412) has been safely stored into nonvolatile memory 224. Finally, verification manager 314 completes the regression checkpoints by determining whether the integrated circuit design has successfully passed the regression test (steps 518 and 536 of FIG. 5).

Figure 7:
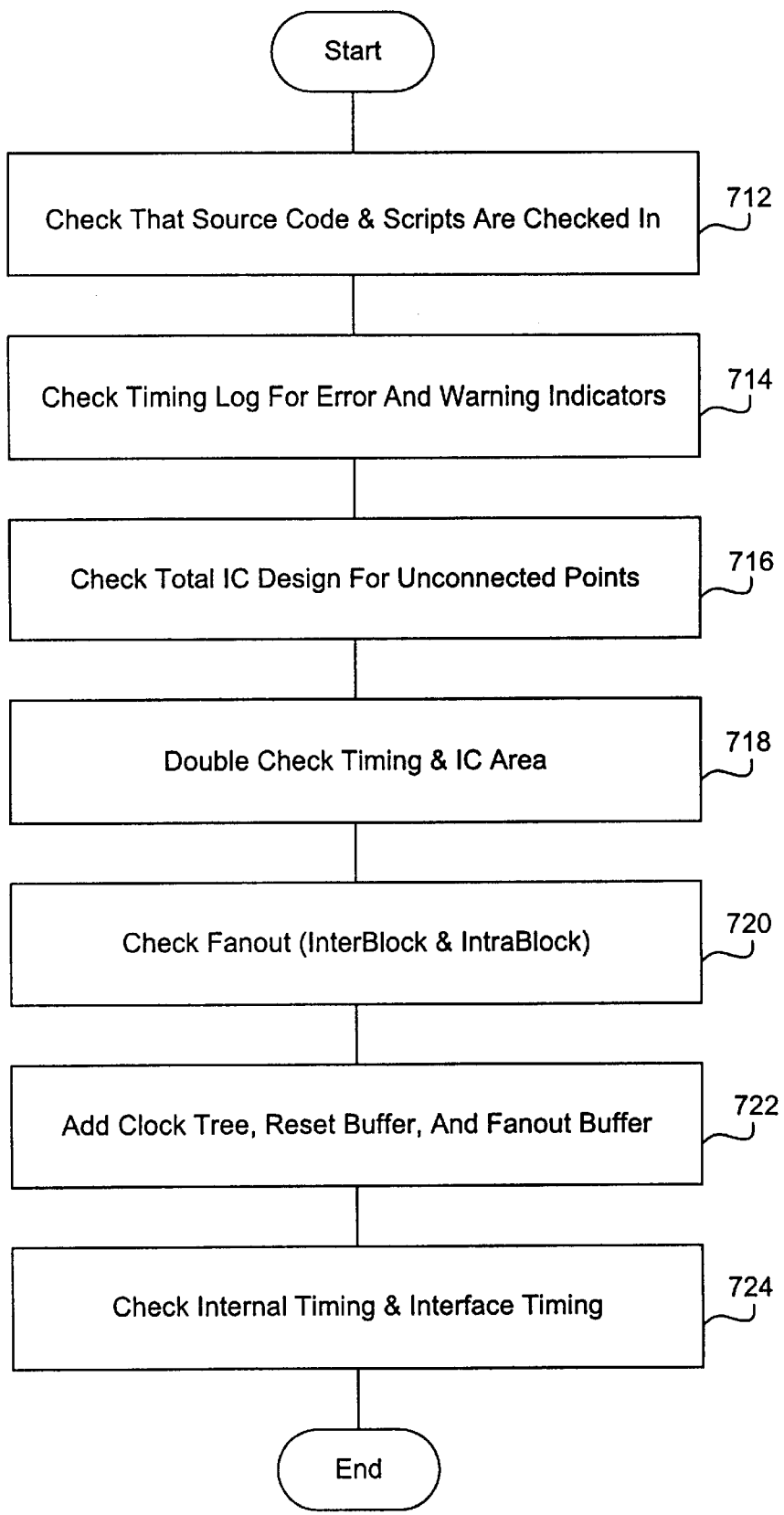
FIG. 7 is a flowchart of method steps for one embodiment of first timing checkpoints, according to the present invention.

Referring now to FIG. 7, a flowchart of method steps for one embodiment of first timing checkpoints is shown, according to the present invention. In alternate embodiments, the foregoing first timing checkpoints may readily include checkpoints that are different or in another sequence than those shown in the FIG. 7 embodiment. The FIG. 7 embodiment corresponds to step 524 of FIG. 5, and further corresponds to step 534 of FIG. 5 prior to the generation of actual SDF 432 in step 540.

Initially, in step 712, synthesis manager 316 verifies that all relevant source code (such as HDL code 412) and constraint scripts 416 are "checked in" at the nonvolatile memory 224. In the preferred embodiment of the present invention, CPU 212 of computer system 210 indicates or "checks out" the software and data that is currently being used in order to ensure that such software and data is only accessed by a single user during a given time period.

In step 714, synthesis manager 316 checks timing log 420 in nonvolatile memory 224, and also checks related warning indicators for any timing error indications for the integrated circuit design. Next, in step 716, synthesis manager 316 checks the total integrated circuit design for any unconnected points or for any components that are not correctly connected. Then, in step 718, synthesis manager 316 double-checks the integrated circuit timing parameters, and also determines the physical area required for the integrated circuit components.

In step 720, synthesis manager 316 checks the fanout parameters for the entire integrated circuit design, both within circuit blocks 114–118 and between circuit blocks 114–118. Then, synthesis manager 316, in step 722, checks a clock tree (component-synchronizing clock circuitry), a reset buffer system, and a fanout buffer system for the integrated circuit design. Finally, in step 724, synthesis manager 316 checks internal timing (for example, setup and hold timing) within circuit blocks 114–118, and also checks interface timing between circuit blocks 114–118.

Figure 8:
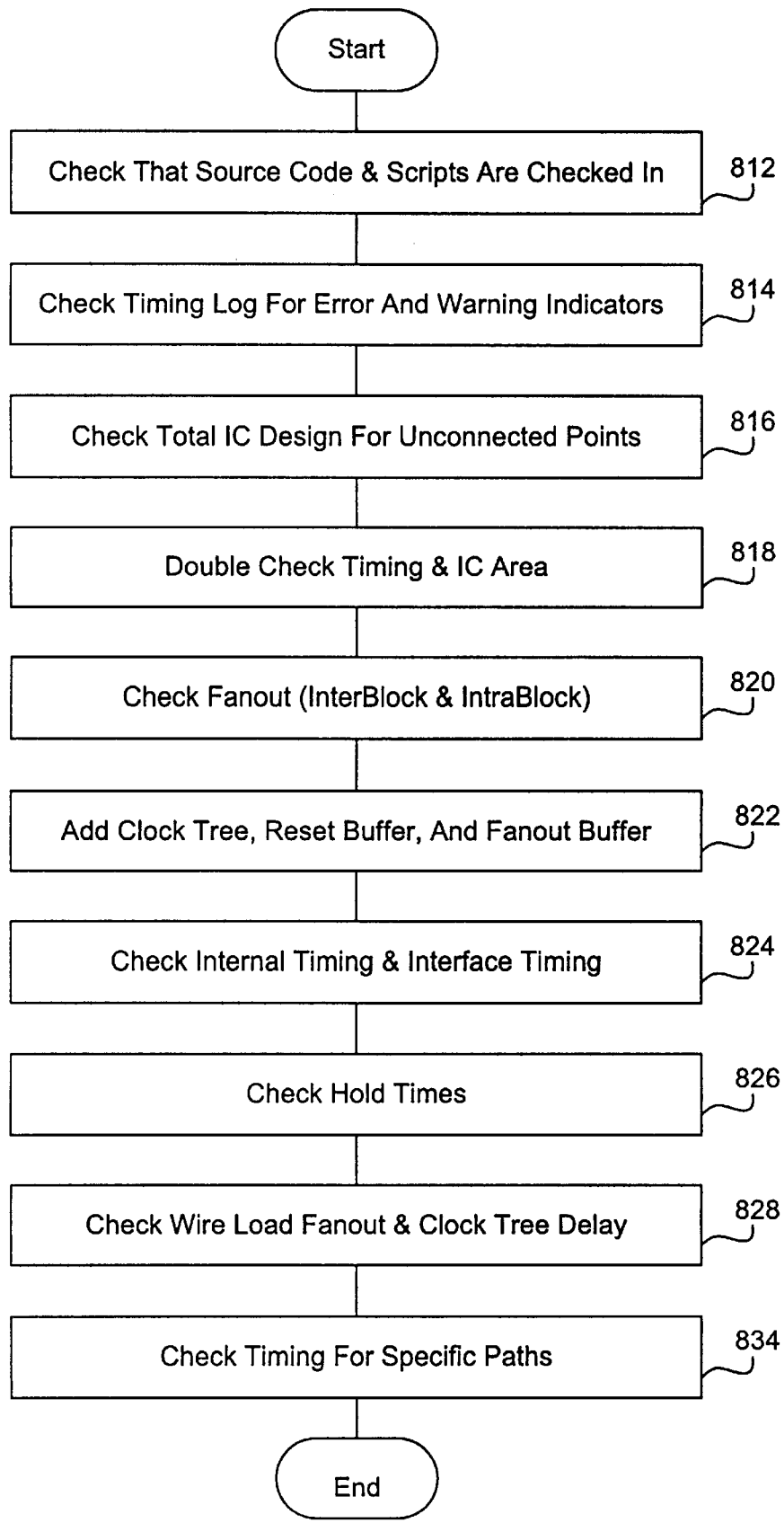
FIG. 8 is a flowchart of method steps for one embodiment of second timing checkpoints, according to the present invention.

Referring now to FIG. 8, a flowchart of method steps for one embodiment of second timing checkpoints is shown, according to the present invention. In alternate embodiments, the foregoing second timing checkpoints may readily include checkpoints that are different or in another sequence than those shown in the FIG. 8 embodiment. The FIG. 8 embodiment corresponds only to step 534 of FIG. 5 subsequent to the generation of actual SDF 432 in step 540.

Initially, in step 812, synthesis manager 316 verifies that all relevant source code (such as actual SDF 432) and constraint scripts 416 are "checked in" at the nonvolatile memory 224. In the preferred embodiment of the present invention, CPU 212 of computer system 210 indicates or "checks out" the software and data that is currently being used in order to ensure that such software and data is only accessed by a single user during a given time period.

In step 814, synthesis manager 316 checks timing log 420 in nonvolatile memory 224, and also checks related warning indicators for any timing error indications for the integrated circuit design. Next, in step 816, synthesis manager 316 checks the total integrated circuit design for any unconnected points or for any components, which are not correctly connected. Then, in step 818, synthesis manager 316 double-checks the integrated circuit timing parameters, and also determines the physical area required for the integrated circuit components.

In step 820, synthesis manager 316 checks fanout parameters for the entire integrated circuit design, both within circuit blocks 114–118 and between circuit blocks 114–118. Then, synthesis manager 316, in step 822, checks the clock tree (component-synchronizing clock circuitry), the reset buffer system, and the fanout buffer system for the integrated circuit design. Next, in step 824, synthesis manager 316 checks internal timing (for example, setup and hold timing) within circuit blocks 114–118, and also checks interface timing between circuit blocks 114–118.

In step 826, synthesis manager 316 checks the hold times between components in the integrated circuit design. Then, in step 828, synthesis manager 316 checks the fanout and the clock tree delay for the integrated circuit design. Finally, synthesis manager 316 checks timing for specific paths in the integrated circuit design. For example, synthesis manager 316 may check timing for paths that have special importance to the integrated circuit design, such as the output path of the integrated circuit.

The invention has been explained above with reference to a preferred embodiment. Other embodiments will be apparent to those skilled in the art in light of this disclosure. For example, the present invention may readily be implemented using configurations and techniques other than those described in the preferred embodiment above. Additionally, the present invention may effectively be used in conjunction with systems other than the one described above as the preferred embodiment. Therefore, these and other variations upon the preferred embodiments are intended to be covered by the present invention, which is limited only by the appended claims.

What is claimed is:

1. A system for creating an electrical circuit design, comprising:

a verification manager configured to verify said electrical circuit design, wherein said verification manager corrects at least one electrical circuit design defect, generates new design code as a result of the correction, simulates operation of said electrical circuit design, and performs a plurality of regression tests on said electrical circuit design, wherein said plurality of regression tests are comprised of a plurality of regression checkpoints that check a regression log for an error indication, update a design defect report, update a test vector matrix, check whether at least one source code is stored in a memory, and check whether a regression test was passed;

a synthesis manager configured to synthesize said electrical circuit design, wherein said synthesis manager performs a synthesis procedure on said electrical circuit design, performs at least one timing test, modifies at least one constraint script when said electrical circuit design fails a timing test, and generates a first net list for said electrical circuit design, wherein said at least one timing test is comprised of a plurality of timing checkpoints that check whether at least one source code and at least one script are stored in a memory, check a timing log and at least one warning indicator for at least one error indication, check said electrical circuit design for unconnected points, check timing for said electrical circuit design, check at least one fanout parameter for said electrical circuit design, and check at least one clock timing, at least one reset buffer, and at least one fanout buffer;

a backend manager configured to implement said electrical circuit design, wherein said backend manager creates a layout for said electrical circuit design, generates a second net list, generates an estimated standard delay format annotated to said second net list, generates an actual standard delay format, and performs a final regression test utilizing said actual standard delay format; and a processor, coupled to said system, to control said verification manager, said synthesis manager, and said backend manager and create said electrical circuit design.

2. The system of claim 1 wherein said electrical circuit design is used to manufacture an integrated circuit device.

3. The system of claim 1 wherein said processor concurrently executes program instructions from said verification manager, said synthesis manager, and said backend manager.

4. The system of claim 1 further comprising a memory device to store said verification manager, said synthesis manager, and said backend manager.

5. The system of claim 1 wherein said processor is a central processing unit with multi-tasking capabilities.

6. The system of claim 3 wherein individual designers separately control said verification manager, said synthesis manager, and said backend manager.

7. The system of claim 1 further comprising a plurality of separate computer systems each containing said verification manager, said synthesis manager, and said backend manager.

8. The system of claim 2, wherein said timing checkpoints further
check internal and external timing for circuit blocks within said integrated circuit design;
check hold times for said integrated circuit design,
check fanout and clock delay for said integrated circuit design, and
check timing for special paths in said integrated circuit design.

9. The system of claim 8 wherein said synthesis manager performs said timing checkpoints only on a final occurrence of said timing test.

10. The system of claim 2 wherein said integrated circuit device is an application-specific integrated circuit.

11. The system of claim 1 wherein a series of design defects in said integrated circuit design are concurrently corrected by said verification manager, said synthesis manager, and said backend manager.

12. A method for creating an electrical circuit design, comprising the steps of:

verifying said electrical circuit design using a verification manager, wherein said verification manager performs the steps of correcting at least one electrical circuit design defect, generating new design code as a result of the correction, simulating operation of said electrical circuit design, and performing a plurality of regression tests on said electrical circuit design, wherein said plurality of regression tests are comprised of a plurality of regression checkpoints that perform the steps of checking a regression log for an error indication, updating a design defect report, updating a test vector matrix, checking whether at least one source code is stored in a memory, and checking whether a regression test was passed;

synthesizing said electrical circuit design using a synthesis manager, wherein said synthesis manager performs the steps of performing at least one timing test, modifying at least one constraint script when said electrical circuit design fails a timing test, and generating a first net list for said electrical circuit design, wherein said at least one timing test is comprised of a plurality of timing checkpoints that perform the steps of checking whether at least one source code and at least one script are stored in a memory, checking a timing log and at least one warning indicator for at least one error indication, checking said electrical circuit design for unconnected points, checking timing for said electrical circuit design, checking at least one fanout parameter for said electrical circuit design, and checking at least one clock timing, at least one reset buffer, and at least one fanout buffer;

implementing said electrical circuit design using a backend manager, wherein said backend manager performs the steps of creating a layout for said electrical circuit design, generating a second net list, generating an estimated standard delay format annotated to said second net list, generating an actual standard delay format, and performing a final regression test utilizing said actual standard delay format; and controlling said verification manager, said synthesis manager, and said backend manager with a processor to thereby create said electrical circuit design.

13. The method of claim 12 wherein said electrical circuit design is for the manufacture of an integrated circuit device.

14. The method of claim 12 wherein said processor concurrently executes program instructions from said verification manager, said synthesis manager, and said backend manager.

15. The method of claim 12 further comprising a memory device for storing said verification manager, said synthesis manager, and said backend manager.

16. The method of claim 12 wherein said processor is a central processing unit with multi-tasking capabilities.

17. The method of claim 14 wherein individual designers separately control said verification manager, said synthesis manager, and said backend manager.

18. The method of claim 12 further comprising a plurality of separate computer systems each containing said verification manager, said synthesis manager, and said backend manager.

19. The method of claim 13, wherein said timing checkpoints further perform the steps of:
   checking internal and external timing for circuit blocks within said integrated circuit design;
   checking hold times for said integrated circuit design,
   checking fanout and clock delay for said integrated circuit design, and
   checking timing for special paths in said integrated circuit design.

20. The method of claim 19 wherein said synthesis manager performs said timing checkpoints only on a final occurrence of said timing test.

21. The method of claim 13 wherein said integrated circuit device is an application-specific integrated circuit.

22. The method of claim 12 wherein a series of design defects in said integrated circuit design are concurrently corrected by said verification manager, said synthesis manager, and said backend manager.

23. A computer-readable medium comprising program instructions for creating an electrical circuit design by performing the steps of:
   verifying said electrical circuit design using a verification manager, wherein said verification manager performs the steps of correcting at least one electrical circuit design defect, generating new design code as a result of the correction, simulating operation of said electrical circuit design, and performing a plurality of regression tests on said electrical circuit design, wherein said plurality of regression tests are comprised of a plurality of regression checkpoints that perform the steps of checking a regression log for an error indication, updating a design defect report, updating a test vector matrix, checking whether at least one source code is stored in a memory, and checking whether a regression test was passed;
   synthesizing said electrical circuit design using a synthesis manager, wherein said synthesis manager performs the steps of performing at least one timing test, modifying at least one constraint script when said electrical circuit design fails a timing test, and generating a first net list for said electrical circuit design, wherein said at least one timing test is comprised of a plurality of timing checkpoints that perform the steps of checking whether at least one source code and at least one script are stored in a memory, checking a timing log and at least one warning indicator for at least one error indication, checking said electrical circuit design for unconnected points, checking timing for said electrical circuit design, checking at least one fanout parameter for said electrical circuit design, and checking at least one clock timing, at least one reset buffer, and at least one fanout buffer;
   implementing said electrical circuit design using a backend manager, wherein said backend manager performs the steps of creating a layout for said electrical circuit design, generating a second net list, generating an estimated standard delay format annotated to said second net list, generating an actual standard delay format, and performing a final regression test utilizing said actual standard delay format; and
   controlling said verification manager, said synthesis manager, and said backend manager with a processor to thereby create said electrical circuit design.

24. A system for creating an electrical circuit design, comprising:
   means for verifying said electrical circuit design using a verification manager, wherein said means for verifying is comprised of means for correcting at least one electrical circuit design defect, means for generating new design code as a result of the correction, means for simulating operation of said electrical circuit design, and means for performing a plurality of regression tests on said electrical circuit design, wherein said plurality of regression tests are comprised of a plurality of regression checkpoints comprising means for checking a regression log for an error indication, means for updating a design defect report, means for updating a test vector matrix, means for checking whether at least one source code is stored in a memory, and means for checking whether a regression test was passed;
   means for synthesizing said electrical circuit design, wherein said means for synthesizing is comprised of means for performing at least one timing test, means for modifying at least one constraint script when said electrical circuit design fails a timing test, and means for generating a first net list for said electrical circuit design, wherein said at least one timing test is comprised of a plurality of timing checkpoints comprised of means for checking whether at least one source code and at least one script are stored in a memory, means for checking a timing log and at least one warning indicator for at least one error indication, means for checking said electrical circuit design for unconnected points, means for checking timing for said electrical circuit design, means for checking at least one fanout parameter for said electrical circuit design, and means for checking at least one clock timing, at least one reset buffer, and at least one fanout buffer;
   means for implementing said electrical circuit design, wherein said means for implementing is comprised of means for creating a layout for said electrical circuit design, means for generating a second net list, means for generating an estimated standard delay format annotated to said second net list, means for generating an actual standard delay format, and means for performing a final regression test utilizing said actual standard delay format; and
   means for controlling said means for verifying, said means for synthesizing, and said means for implementing to thereby create said electrical circuit design.

25. The system of claim 24 wherein said electrical circuit design is to manufacture of an integrated circuit device.

26. The system of claim 24 wherein said means for controlling concurrently executes program instructions from said means for verifying, said means for synthesizing, and said means for implementing.

* * * * *